United States Patent [19]

Hamada

[11] 3,956,716
[45] May 11, 1976

[54] PULSE WIDTH MODULATED SIGNAL AMPLIFIER

[75] Inventor: Osamu Hamada, Tokyo, Japan

[73] Assignee: Sony Corporation, Tokyo, Japan

[22] Filed: Mar. 26, 1975

[21] Appl. No.: 562,144

[30] Foreign Application Priority Data

Mar. 28, 1974 Japan.............................. 49-35309

[52] U.S. Cl.................................... 332/12; 332/14
[51] Int. Cl.² ........................................... H03K 7/08
[58] Field of Search ............... 332/12, 9 R, 9 T, 14, 332/15

[56] References Cited
UNITED STATES PATENTS 3,253,228   5/1966   Montner .............................. 332/12

Primary Examiner—John Kominski
Attorney, Agent, or Firm—Hill, Gross, Simpson, Van Santen, Steadman, Chiara & Simpson

[57] ABSTRACT

A pulse width modulated signal amplifier including a signal input circuit, a clock pulse generating circuit, a pulse phase modulating circuit and a pair of pulse transformers. The pulse phase modulating circuit is supplied with the output signal of the signal input circuit and the clock pulse signal in such a manner as to produce a pair of pulse signals having a phase difference which is proportional to the output signal level of the signal input circuit. Each primary coil of the transformer is supplied with a pair of pulse signals, and the secondary coils are connected so as to add and subtract the pulse signals respectively. A rectifying circuit is supplied with the output signals from the secondary coils so as to produce the finally constituted pulse width modulated signals where the width of the pulse is proportional to the output signal level of the signal input circuit. At the same instance it is applied to a load through a low pass filter.

10 Claims, 13 Drawing Figures

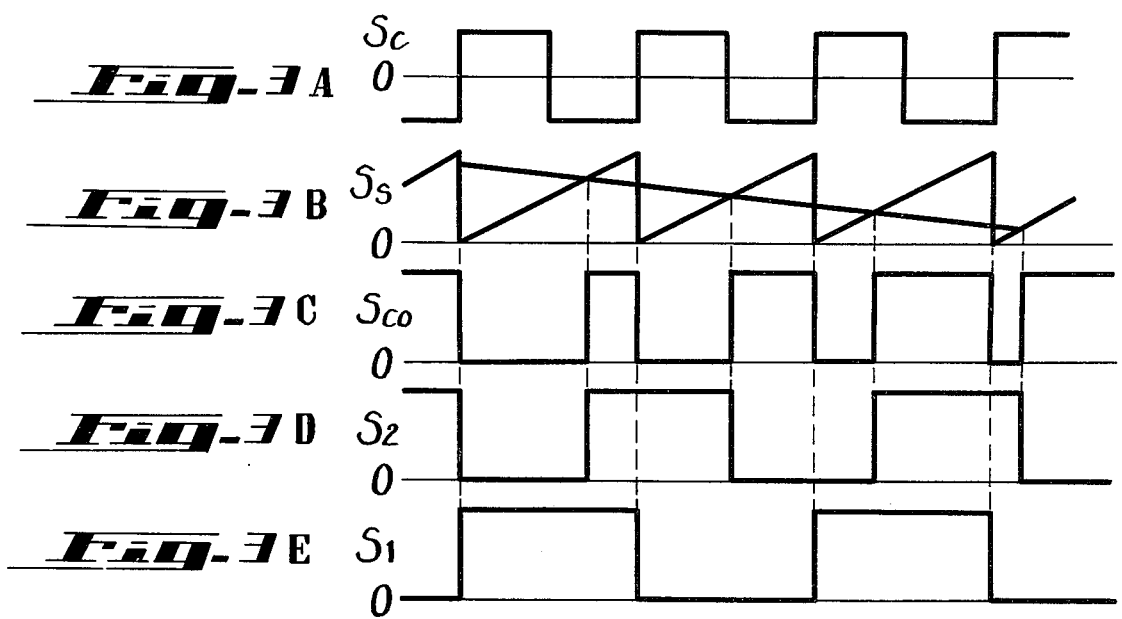
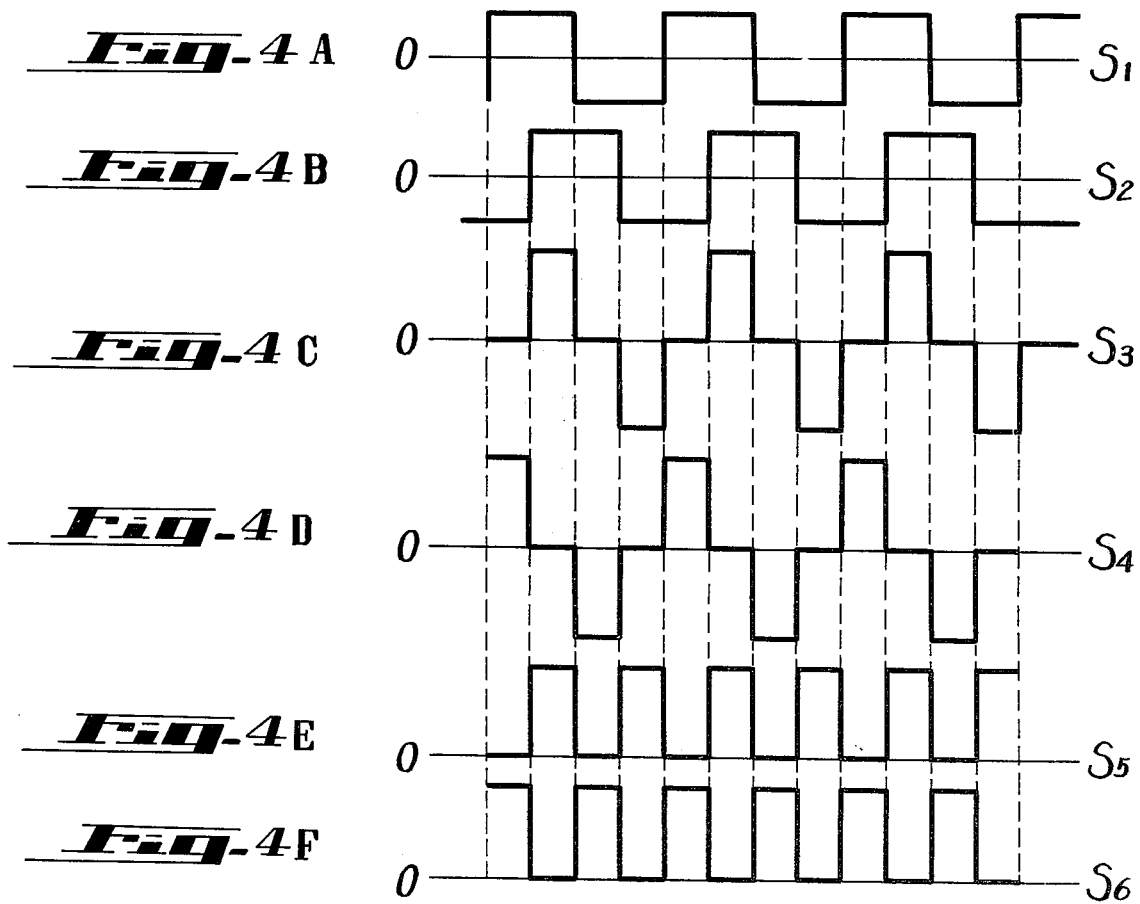

PULSE WIDTH MODULATED SIGNAL AMPLIFIER

BACKGROUND OF THE INVENTION

1. Field of the Invention

The field of art to which this invention pertains is pulse width modulation circuits and more particularly to a pulse width modulation single amplifier which produces a large output more simply than prior art devices.

2. Description of the Prior Art

In prior art pulse width modulated signal amplifiers, the demodulated signal is voltage-amplified by a low frequency transformer and then fed to a load such as a capacitor-speaker. In such arrangements, the high frequency characteristics of the signal may be deteriorated by the characteristics of the low frequency transformer.

In connection with such a system, the pulse width modulated signal may be amplified by the use of a high frequency pulse transformer before it is demodulated. There are defects in such a system. Since the pulse width modulated signal includes a carrier signal, its side band signal components and modulated signal components, the high frequency pulse transformer must have a sufficient pass band to permit the passage of signals from a low frequency to a high frequency such as the higher side band components of the carrier which in practice is virtually impossible to achieve.

In a method where pulse phase modulation is used, a pulse phase modulated signal contains a carrier signal and upper and lower side band components such that a high frequency pulse transformer could be used, but a demodulator for use with this system becomes quite complicated in construction.

SUMMARY OF THE INVENTION

It is a principal object of the present invention to provide a pulse width modulation signal amplifier which includes a signal input circuit, a clock pulse generating means, pulse phase modulating means to produce a pair of pulse signals having a phase difference therebetween which is proportional to the output signal level of the signal input circuit and wherein means are provided for combining said pair of pulse signals to convert them into a pulse width modulator signal which is then supplied to a load through a low pass filter.

It is also an object of the present invention to provide a pulse width modulated signal amplifier which produces a large output signal with a simple circuit construction.

It is another object of the present invention to provide a pulse width modulated signal amplifier which employs a pulse transformer for amplifying a pulse width modulated signal.

It is also an object of the present invention to provide a pulse width modulated signal amplifier in which a pulse phase modulated signal is amplified by a pulse transformer and also in which the conversion of the pulse phase modulation to pulse width modulation is accomplished.

It is yet another object of the present invention to provide a pulse width modulated signal amplifier which is suitable for driving a capacitor speaker.

It is another object of the present invention to provide a pulse width modulated signal amplifier which is effective for driving a load of the balance type.

These and other objects, features and advantages of the present invention will be understood in greater detail from the following description of the associated drawings wherein reference numerals are utilized to designate a preferred embodiment.

BRIEF DESCRIPTION OF THE DRAWINGS

FIGS. 3A to 3E, inclusive, are waveform diagrams of pulse signals used for explaining the operation of the pulse phase modulator shown in FIG. 2; and FIGs. 4A to 4F, inclusive, are waveform diagrams of pulse signals used for explaining the embodiment of the invention shown in FIG. 1.

DESCRIPTION OF THE PREFERRED EMBODIMENT

Figure 1:
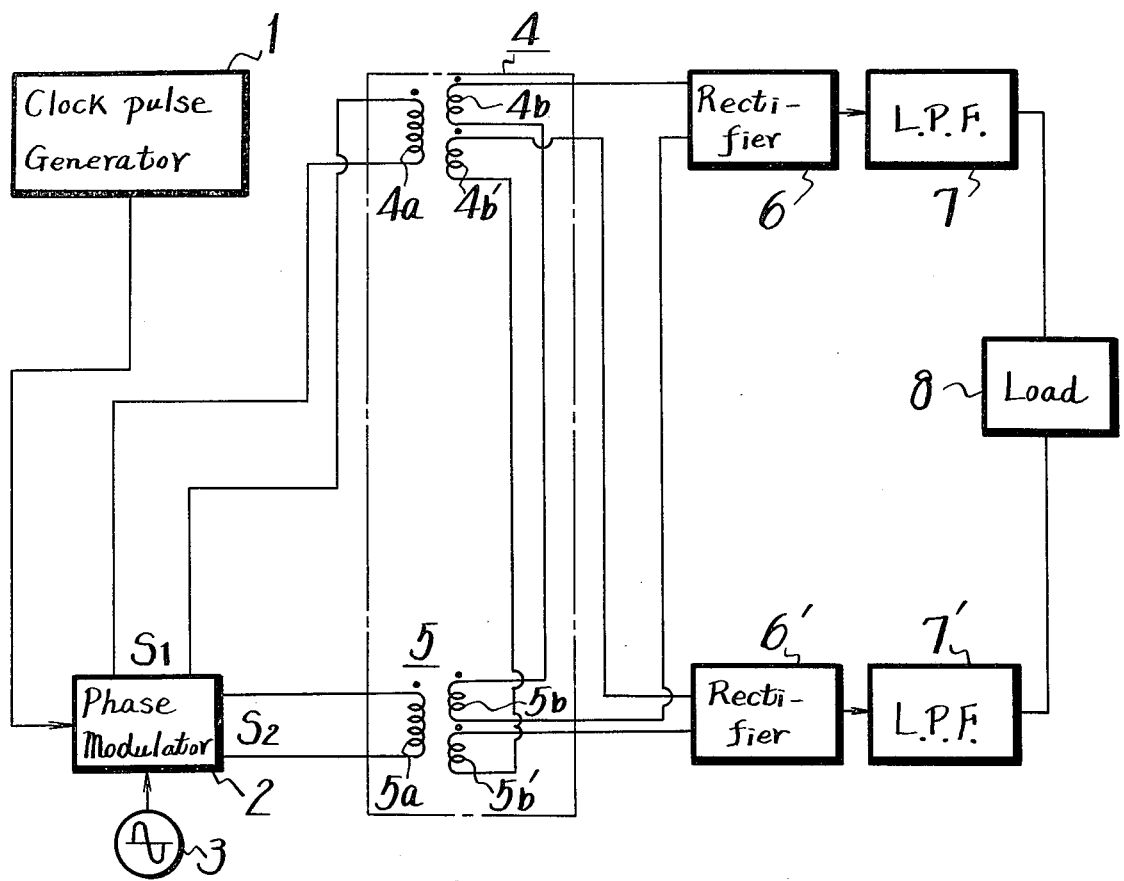
FIG. 1 is a schematic block diagram showing an embodiment of the pulse width modulated signal amplifier according to the invention.

In the embodiment of the invention shown in FIG. 1, a load is connected in a balanced transformer less (which will be hereinafter referred to as a BTL) manner in which a pair of signals reversed in phase are applied to both ends of the load and an output signal of double the magnitude is obtained. FIG. 1, shows a clock pulse generator 1 and a pulse phase modulator 2 which is supplied with a clock pulse signal from the clock pulse generator 1 and which is also applied with a signal from a low frequency signal source 3. The pulse phase modulator produces a pulse phase modulation signal.

Figure 2:
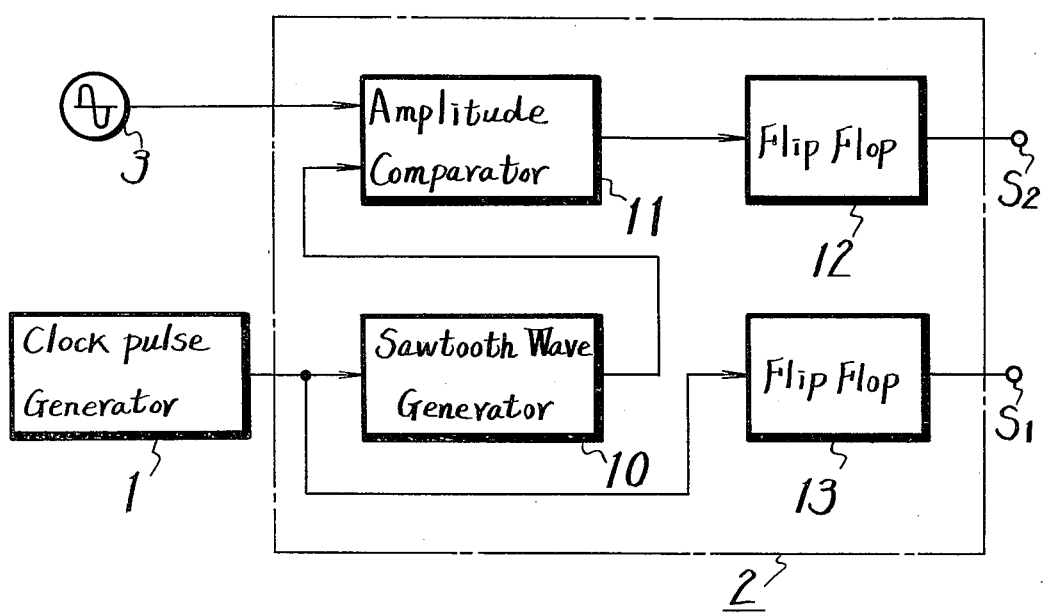
FIG. 2 is a schematic block diagram showing an example of pulse phase modulator which can be used in the invention.

An example of the pulse phase modulator 2 is shown in FIG. 2. A clock pulse signal $S_c$ shown in FIG. 3A, from the clock pulse generator 1, is applied to a sawtooth wave generator 10 which produces a sawtooth waveform signal $S_s$ having the same frequency as that of the clock pulse signal $S_c$. $S_s$ is shown in FIG. 3B. The sawtooth waveform signal $S_s$ and the low frequency signal are supplied to an amplitude comparator 11. An amplitude-compared output signal $S_{co}$, shown in FIG. 3C, from the amplitude comparator 11 is supplied to a flip-flop 12 which produces an output pulse signal $S_2$ shown in FIG. 3D. A flip-flop 13 is supplied with the clock pulse signal $S_c$ and controlled in set and reset to produce an output pulse signal $S_1$, as shown in FIG. 3E.

The pulse signals $S_1$ and $S_2$ have a phase difference between them which is proportional to the level of the input signal. $S_1$ and $S_2$ are supplied to primary coils 4a and 5a of high frequency or pulse transformers 4 and 5, respectively, as shown in FIG. 1 to be boosted thereby. Output signals obtained across secondary coils 4b, 4b' of the pulse transformer 4 and those across secondary coils 5b, 5b' of the pulse transformer 5 are added to or substracted from each other and then rectified by circuits 6 and 6', respectively, for the pulse signals $S_1$ and $S_2$ to be converted into a pair of pulse width modulated signals of opposing phase. The output signals from the rectifier circuits 6 and 6' are applied to low pass filters 7 and 7' respectively, which pass a pair of low frequency signal components reversed in phase. The low frequency signal components reversed in phase from the low pass filters 7 and 7' are fed to a load 8. As an example only, a rectangular waveform which has a frequency of 100 KH$_z$ and a duty of 50% can be used as the signal S$_1$.

A so-called pulse transformer which can transmit the frequency components of the reference pulse signal S$_1$ sufficiently is used as the high frequency transformers 4 and 5 to obtain signals with enough voltage for driving the load 8 such as the capacitor speaker.

To drive the load 8 in BTL manner, the secondary coils 4$b'$ and 5$b'$ are provided in connection with the pulse transformers 4 and 5, respectively. Also the rectifier circuit 6' and low pass filter 7' are provided. Thus, the output signals from the coils 4$b'$ and 5$b'$ are added by reversing one of them in phase. They are then rectified by the rectifier circuit 6' and applied to the load 8 through the low pass filter 7'. The output pulse signals from the coils 4$b$ and 5$b$ are added and then rectified to obtain the pulse width modulated signal which is applied to the load 8 through the rectifier 7. Either a full-wave rectifier may be used here or a half-wave may be employed.

At the input side of the rectifier circuit 6 there is obtained a signal S$_3$ which is the sum of the pulse signals S$_1$ and S$_2$ ($S_3 = S_1 + S_2$) as shown in FIG. 4C, while at the input side of the rectifier circuit 6' there is obtained a signal S$_4$ which is the subtraction of the pulse signals S$_1$ and S$_2$ ($S_4 = S_1 + S_2$) as shown in FIG. 4D. These signals S$_3$ and S$_4$ are rectified by the rectifier circuits 6 and 6' which are, for example, full-wave rectifiers to be signals S$_5$ and S$_6$ as shown in FIGS. 4E and 4F, respectively. These signals S$_5$ and S$_6$ represent the pulse width modulated signals converted from the pulse phase modulated signals, respectively, and are fed to the low pass filters 7 and 7' to be a pair of low frequency signals of opposing phase which are then applied to the load 8.

The high frequency or pulse transformers 4 and 5 are used so that a signal of wide band can be transmitted as compared with the prior art in which a low frequency transformer is used.

In general, the capacity of the capacitor-speaker between its electrodes is about 150~500 p$^F$ and its driving voltage is about 1000~3000 volts. In order to produce a prior art output signal of 100 W/$_8$ $_Ω$ , the turns ratio of the coils of the pulse transformer is about 106 since the driving voltage is 28.2 volts. Accordingly, it is necessary that the turns ratio of the coils of the transformers 4 and 5 be increased so as to obtain high voltages across the secondary coils 4$b$, 4$b'$, 5$b$ and 5$b'$, but since high frequency pulse transformers are used their transmission characteristics are not deteriorated. Therefore, the amplifier of the present invention is suited for use as a drive for capacitor speakers.

Since the capacitor speaker itself is capacitive, its capacitive component serves as the capacitors for the low pass filters.

A pair of rectifier circuits 6 and 6' and a pair of the low pass filters 7 and 7' are employed, but individual ones of the respective pairs can be omitted. For example, the coils 4$b'$ and 5$b'$, the rectifier circuit 6' and the low pass filter 7' can be omitted. In such a case, low frequency components of the pulse signals shown in FIGS. 4E and 4F are derived.

It will be apparent that many modifications and variations could be effected by one skilled in the art without departing from the spirits and scope of the novel concepts of the invention.

I claim as my invention:

1. A pulse width modulated signal amplifier comprising:
   a pulse phase modulator,
   a clock pulse generator,
   means for supplying a signal input and an output of said clock pulse generator to said pulse phase modulator,
   said pulse phase modulator having circuit means for producing a pair of pulse signals having a phase difference which is proportional to the level of said applied signal input,
   means for combining said pair of pulses to produce a resulting pulse width modulated signal, and
   means for applying said pulse width modulated signal to a load.

2. A pulse width modulated signal amplifier in accordance with claim 1 wherein said pulse width modulated signal is passed through a low-pass filter prior to being applied to said load.

3. A pulse width modulated signal amplifier in accordance with claim 1 wherein said means for combining said pair of pulse signals comprises a pair of pulse transformers each having at least one primary coil and a pair of scondary coils, each of said primary coils being supplied with said pair of pulse signals, each secondary coil of each transformer being connected in series with one secondary coil of the other transformer, one series connection of said coils being arranged to add the pulse signals and the other series connection of said coils being arranged to subtract the pulse signals, rectifying means supplied with an output signal from said secondary coils in such a manner as to produce a pulse width modulated signal proportional to the level of the applied input signal.

4. A pulse width modulated signal amplifier in accordance with claim 2 in which said load comprises a capacitor-type speaker and said low-pass filter includes at least a capacitor used as the capacitance of said capacitor-type speaker.

5. A pulse width modulated signal amplifier in accordance with claim 3 wherein said rectifying means comprises a 4-way rectifier.

6. A pulse width modulated signal amplifier in accordance with claim 1 in which said combining means comprises a first signal combining means supplied with said pair of pulse signals to convert them into a first pulse width modulated signal, and a second signal combining means supplied with said pair of pulse signals so as to convert them into a second pulse width modulated signal having an opposed phase with respect to said first pulse width modulated signal.

7. A pulse width modulated signal amplifier in accordance with claim 6 in which said first signal combining means comprises a pair of pulse transformers each having a primary and secondary coils, each of the primary coils being supplied with said pair of pulse signals, said secondary coils being connected so as to add pulse signals across them, first rectifying means supplied with an output signal from said secondary coils so as to produce said first pulse width modulated signal, said second signal combining means comprising said same pair of pulse transformers having a further pair of secondary coils connected to subtract pulse signals applied across them, and second rectifying means supplied with an output signal of said further pair of secondary coils so as to produce said second pulse width modulated signal.

8. A pulse width modulated signal amplifier in accordance with claim 1 wherein said pulse phase modulating means comprises a saw tooth wave generator for producing a saw tooth wave signal, means for amplitude comparison of the applied signal input with the saw tooth wave signal, a first flip flop circuit supplied with an output of said amplitude comparison means and producing thereby a pulse phase modulated signal which is proportional to the level of the applied input signal, a second flip flop circuit supplied with an output of said clock pulse generator to produce a pulse signal which is synchronized to said clock pulse generator output.

9. A pulse width modulated signal amplifier comprising means for developing a pair of signals which vary in phase with each other in accordance with the level of a modulating signal, a pair of pulse transformers, means for applying each of the phase varying signals to the transformers, the transformers each having a secondary winding connected in series with the secondary winding of the other transformer, one set of said secondaries being connected in series adding relationship, and the other set being connected in series substracting relationship, means for combining the outputs of said secondary sets, means for rectifying the same and applying the output signal to a load.

10. A pulse width modulated circuit in accordance with claim 1, wherein said phase modulation means includes means for making a comparison between a saw tooth signal and the applied input signal.

* * * * *